United States Patent
Kauffman

(10) Patent No.: US 12,161,106 B2
(45) Date of Patent: Dec. 10, 2024

(54) SYSTEM AND METHOD FOR CONTROLLING A SHOCK OUTPUT OF AN ELECTRONIC ANIMAL TRAP

(71) Applicant: Woodstream Corporation, Lancaster, PA (US)

(72) Inventor: Matthew Kauffman, Lititz, PA (US)

(73) Assignee: Woodstream Corporation, Lancaster, PA (US)

( * ) Notice: Subject to any disclaimer, the term of this patent is extended or adjusted under 35 U.S.C. 154(b) by 746 days.

(21) Appl. No.: 16/713,171

(22) Filed: Dec. 13, 2019

(65) Prior Publication Data

US 2021/0176980 A1 Jun. 17, 2021

(51) Int. Cl.
*A01M 23/38* (2006.01)
*H02J 7/00* (2006.01)
*H03K 17/687* (2006.01)

(52) U.S. Cl.
CPC ........... *A01M 23/38* (2013.01); *H02J 7/0063* (2013.01); *H03K 17/687* (2013.01)

(58) Field of Classification Search
CPC ....... F41B 15/04; A01M 23/38; H02J 7/0063; H03K 17/687
See application file for complete search history.

(56) References Cited

U.S. PATENT DOCUMENTS

| | | | | |
|---|---|---|---|---|
| 2,809,514 A | * | 10/1957 | Corcoran | G01N 3/317 73/662 |
| 4,872,084 A | * | 10/1989 | Dunning | H05C 1/04 231/7 |
| 5,773,961 A | * | 6/1998 | Cameron | H01M 10/48 320/132 |
| 7,219,466 B2 | * | 5/2007 | Rich | A01M 23/38 43/98 |
| 7,450,429 B2 | * | 11/2008 | Daga | G11C 16/12 365/185.23 |
| 8,505,235 B2 | | 8/2013 | Rich et al. | |
| 2001/0047220 A1 | * | 11/2001 | Niimi | H03K 17/693 700/170 |

(Continued)

FOREIGN PATENT DOCUMENTS

| | | | | |
|---|---|---|---|---|
| CN | 1885702 A | * | 12/2006 | ............ G03G 15/80 |
| CN | 204304566 U | * | 4/2015 | |

(Continued)

OTHER PUBLICATIONS

PCT Notification, The International Search Report and the Written Opinion of the International Searching Authority, dated Mar. 19, 2021, 13 pages.

(Continued)

*Primary Examiner* — Lincoln D Donovan
*Assistant Examiner* — James G Yeaman
(74) *Attorney, Agent, or Firm* — Barley Snyder

(57) ABSTRACT

A system for controlling a shock output of an electronic animal trap includes a battery, a transformer having a primary coil connected to the battery, and a controller connected to the battery and the primary coil. The controller has a shock cycle module determining a battery capacity of the battery and determining a shock enable time based on the battery capacity. The shock cycle module controls a primary current from the battery to run through the primary coil for the shock enable time.

27 Claims, 6 Drawing Sheets

(56) References Cited

U.S. PATENT DOCUMENTS

| | | | | |
|---|---|---|---|---|
| 2005/0225366 | A1* | 10/2005 | Sohn | H03L 7/0893 |
| | | | | 327/156 |
| 2008/0054961 | A1* | 3/2008 | Rasaratnam | H02M 3/07 |
| | | | | 327/157 |
| 2010/0008012 | A1* | 1/2010 | Ben-Yaakov | H05C 1/02 |
| | | | | 361/232 |
| 2011/0001435 | A1* | 1/2011 | Wray | H05B 45/395 |
| | | | | 315/291 |
| 2012/0167292 | A1* | 7/2012 | Baumoel | A47K 13/10 |
| | | | | 4/246.1 |
| 2012/0240450 | A1 | 9/2012 | Bucher et al. | |
| 2014/0098453 | A1* | 4/2014 | Brundula | F41H 5/24 |
| | | | | 361/232 |
| 2017/0063115 | A1* | 3/2017 | Touchton | H02J 7/0042 |
| 2018/0115992 | A1* | 4/2018 | Park | H04W 72/1278 |
| 2018/0139949 | A1 | 5/2018 | Liu | |
| 2019/0230915 | A1* | 8/2019 | Wanninger | H02M 3/155 |
| 2019/0326501 | A1* | 10/2019 | Gilbert | H02K 55/00 |

FOREIGN PATENT DOCUMENTS

| | | | | | |
|---|---|---|---|---|---|
| CN | 105539363 | A | * | 5/2016 | ........... H03K 17/955 |
| CN | 107592011 | A | * | 1/2018 | |
| CN | 206895889 | U | * | 1/2018 | |
| CN | 109416551 | A | * | 3/2019 | ............... G01K 7/24 |
| DE | 102008006199 | A1 | * | 7/2009 | ............... F01L 1/352 |
| EP | 2712072 | A1 | | 3/2014 | |
| JP | 2001183728 | A | * | 7/2001 | |
| KR | 20000025250 | A | * | 5/2000 | |
| NZ | 560460 | A | * | 11/2008 | ........... A01K 15/029 |
| WO | 2004098280 | A1 | | 11/2004 | |
| WO | WO-2012073534 | A1 | * | 6/2012 | ........... G01R 31/025 |
| WO | 2019133340 | A1 | | 7/2019 | |

OTHER PUBLICATIONS

PCT International Preliminary Search Report on Patentability and Written Opinion, Application No. PCT/US2020/064638, Dated: May 17, 2022, 6 pages.

\* cited by examiner

SYSTEM AND METHOD FOR CONTROLLING A SHOCK OUTPUT OF AN ELECTRONIC ANIMAL TRAP

FIELD OF THE INVENTION

The present invention relates to an electronic animal trap and, more particularly, to controlling a shock output of an electronic animal trap.

BACKGROUND

Electronic animal traps function by delivering an electric shock of a certain power to an animal in the trap. The level of delivered power is designed to reliably kill the trapped animal. To generate the shock, some electronic animal traps draw power from batteries. The output voltage from the batteries dictates in part the power of the shock delivered by the trap.

The output voltage of the batteries, however, decreases over the life of the batteries. The power of the shock output by the trap is therefore dependent on the remaining battery life; the electronic trap outputs a shock with more power than designed when the batteries are new, and outputs a shock with less power than designed when the batteries are low. Using more power than necessary when the batteries are new results in a shorter lifespan of the batteries and a correspondingly lesser number of uses of the electronic trap before replacing the batteries. Using less power than necessary when the batteries are low results in a less reliable kill of the trapped animal.

SUMMARY

A system for controlling a shock output of an electronic animal trap includes a battery, a transformer having a primary coil connected to the battery, and a controller connected to the battery and the primary coil. The controller has a shock cycle module determining a battery capacity of the battery and determining a shock enable time based on the battery capacity. The shock cycle module controls a primary current from the battery to run through the primary coil for the shock enable time.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
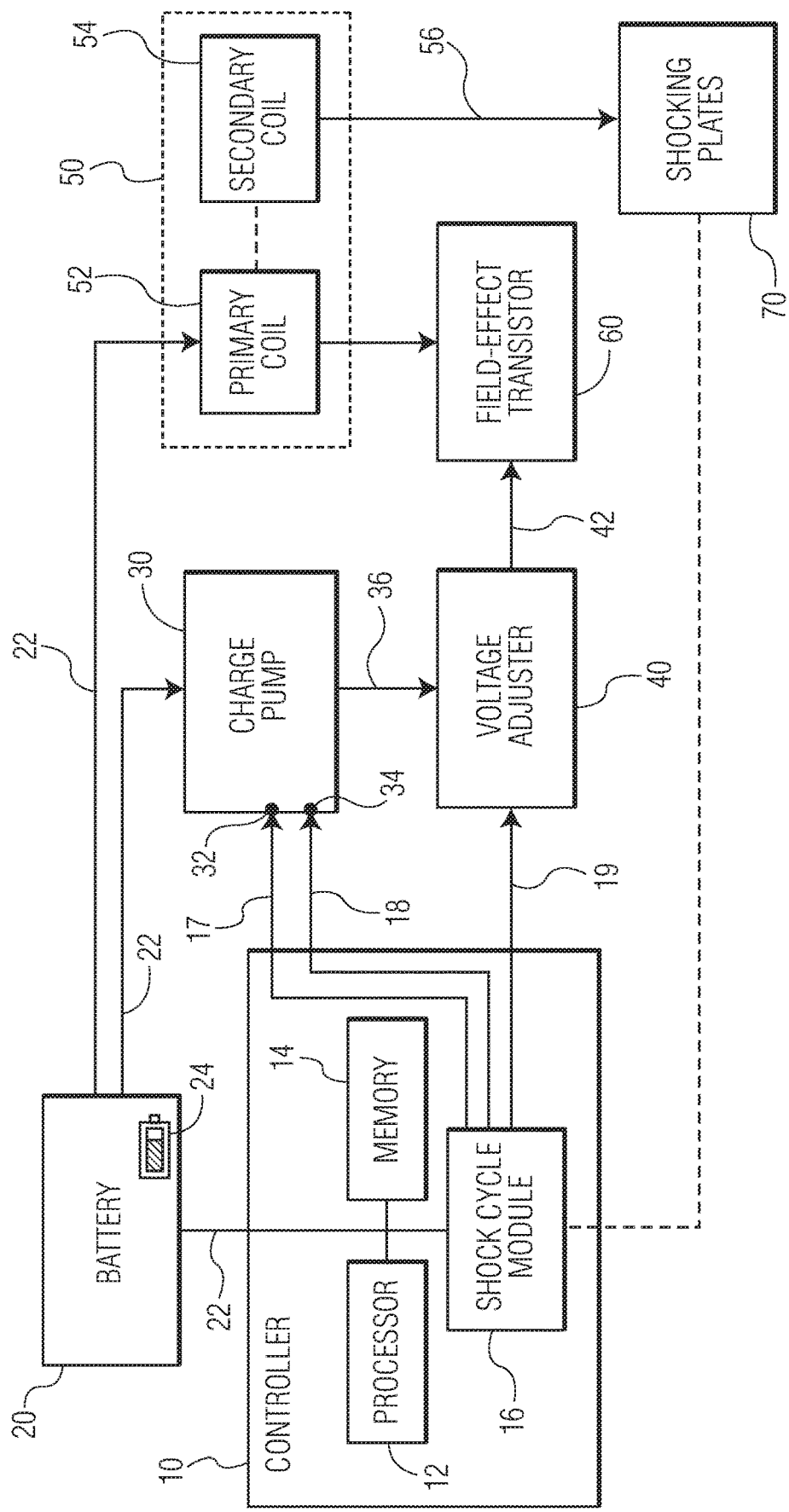
FIG. 1 is a schematic block diagram of a system of an electronic animal trap according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiment set forth herein; rather, these embodiments are provided so that the present disclosure will convey the concept to those skilled in the art.

Figure 2:
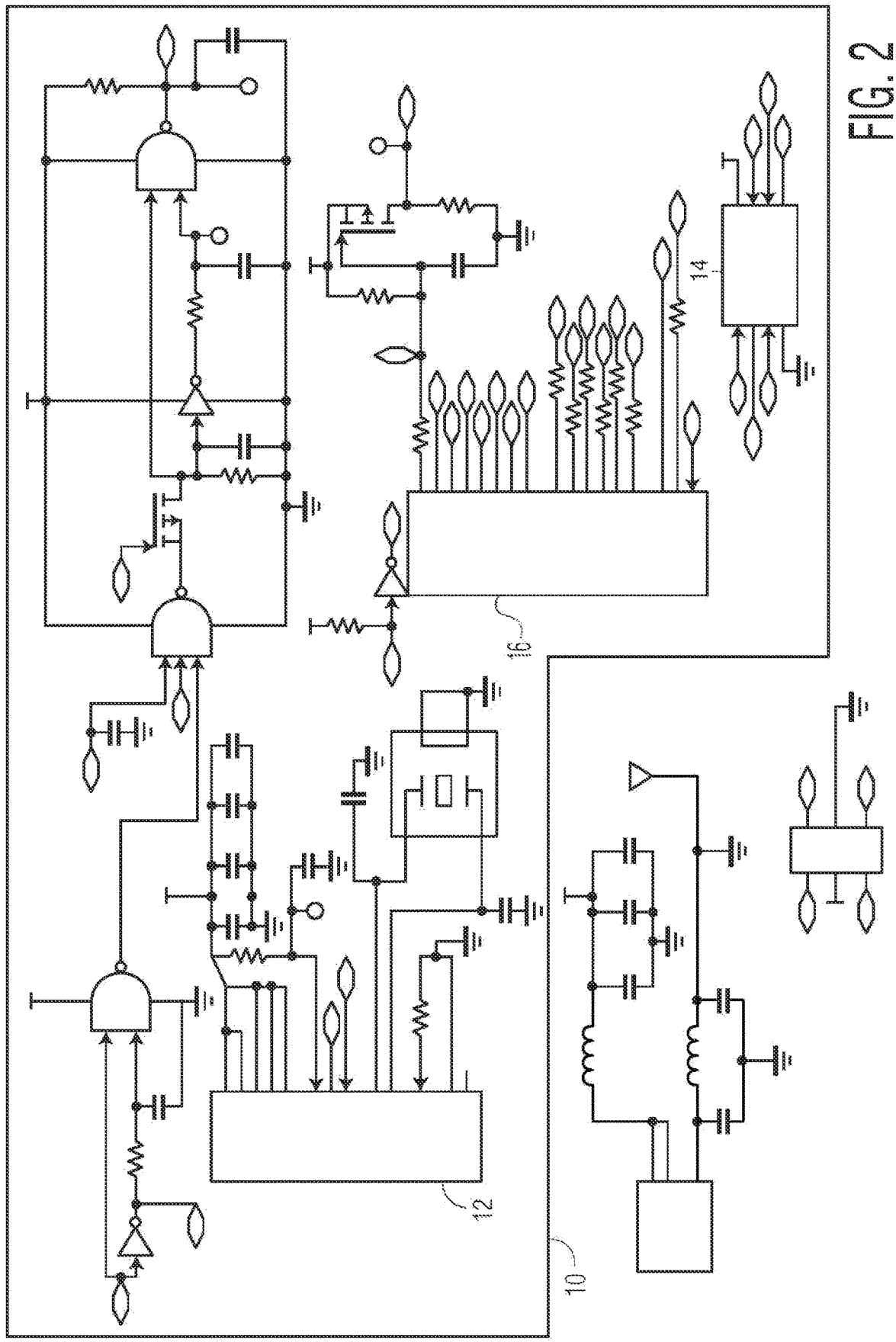
FIG. 2 is a circuit diagram of a controller of the system.
Figure 3:
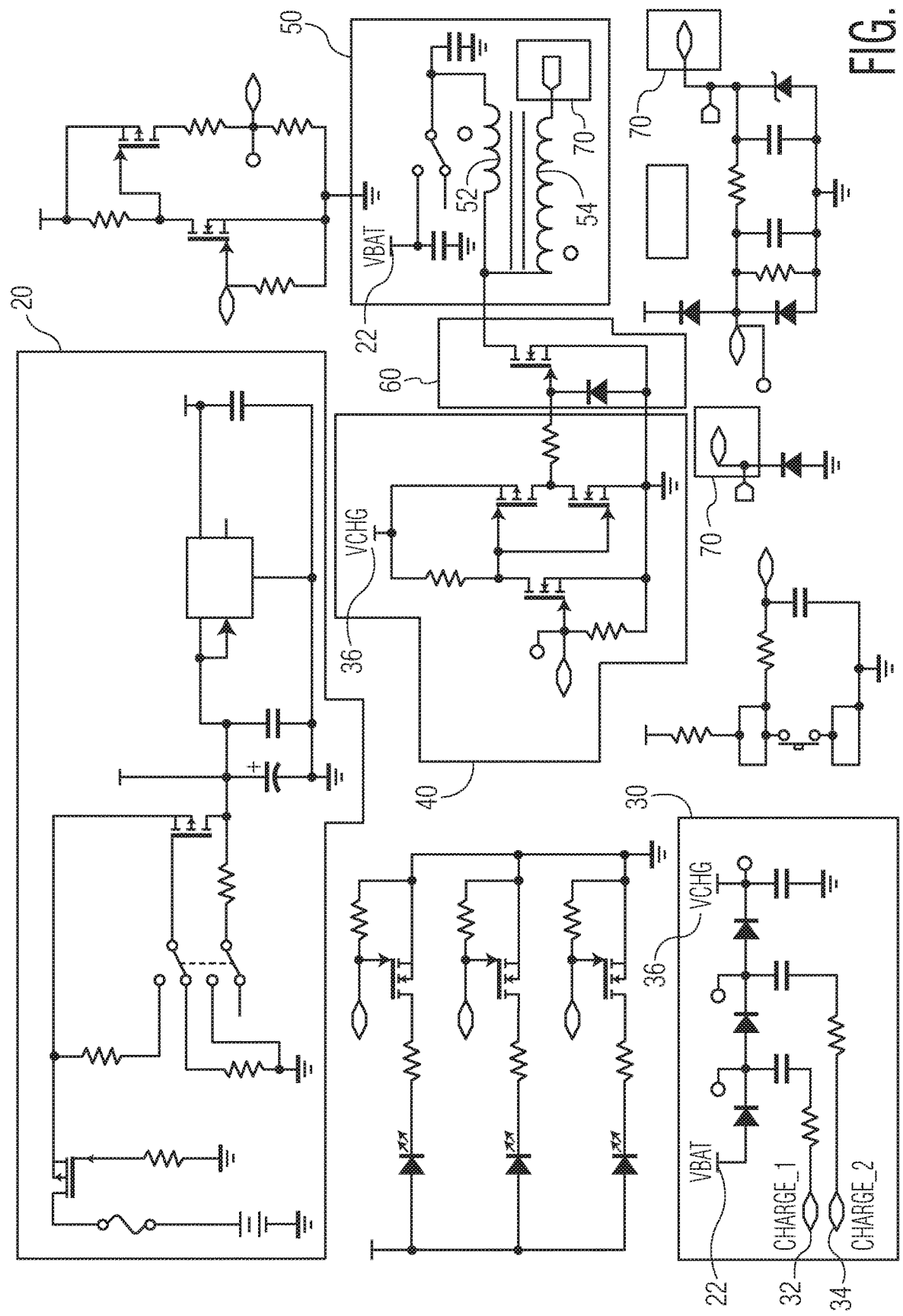
FIG. 3 is a circuit diagram of the system.

A system of an electronic animal trap according to an embodiment for controlling a shock output of the electronic animal trap is shown in FIGS. 1-3. The system, as shown in FIG. 1, comprises a controller 10, a battery 20, a charge pump 30 connected to the controller 10 and the battery 20, a voltage adjuster 40 connected to the controller 10 and the charge pump 30, a transformer 50 connected to the battery 20, a field-effect transistor 60 connected to the voltage adjuster 40 and the transformer 50, and a plurality of shocking plates 70.

Figure 4:
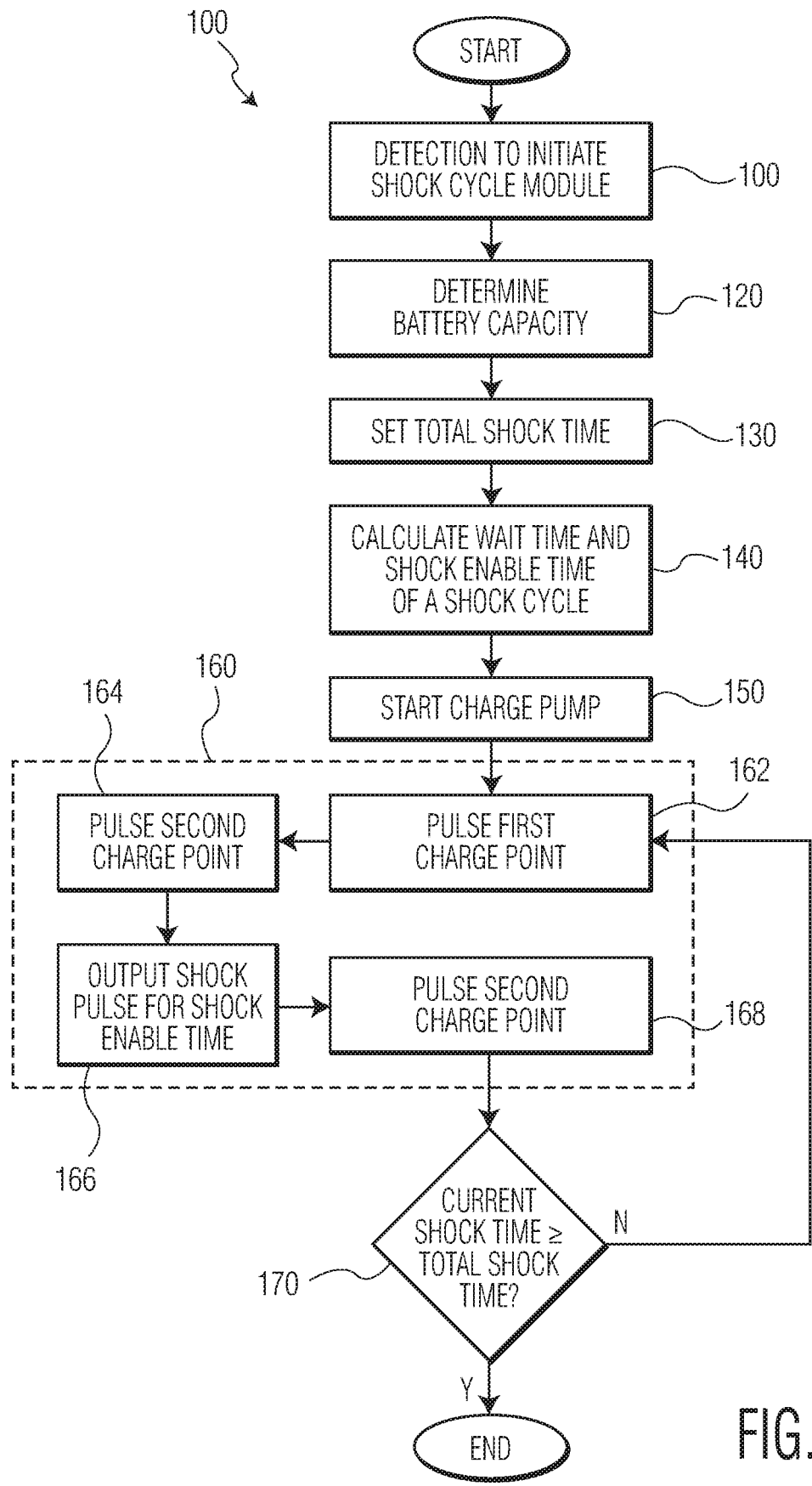
FIG. 4 is a flowchart of an adjustment of a shock output voltage of the system.

The controller 10, as shown in FIGS. 1 and 2, includes a processor 12, a memory 14 connected to the processor 12, and a shock cycle module 16. The memory 14 is a non-transitory computer readable medium, such as ROM or RAM, capable of storing computer instructions thereon that are executable by the processor 12. The shock cycle module 16, described in greater detail below with reference to FIG. 4, is a process or a series of functions performed by the controller 10 when the processor 12 executes an algorithm stored in the memory 14.

The controller 10, as shown in FIG. 1, transmits a first charge pulse 17 and a second charge pulse 18 to the charge pump 30, and transmits a shock pulse 19 to the voltage adjuster 40. In an embodiment, the first charge pulse 17, the second charge pulse 18, and the shock pulse 19 are each 3.3 volts (V).

The battery 20, as shown in FIGS. 1 and 3, is connected to the controller 10, the charge pump 30, and the transformer 50 and supplies a battery voltage 22 to the controller 10, the charge pump 30, and the transformer 50. In an embodiment, the battery voltage 22 is approximately 6 V. In an embodiment, the battery 20 is a plurality of D cell batteries, for example, four D cell batteries. In other embodiments, the battery 20 may be a single or any combination of known batteries capable of supplying a voltage necessary for a shock power described herein. The battery 20 has a battery capacity 24 corresponding to an approximate remaining life or capacity of the battery 20. In the shown embodiment, the battery capacity 24 is expressed as a percentage, but may alternatively be any other measure of capacity.

The charge pump 30, as shown in FIGS. 1 and 3, receives the battery voltage 22 from the battery 20 and is connected to the controller 10 and the voltage adjuster 40. The charge pump 30 is connected to the controller 10 at a first charge point 32 and a second charge point 34; the first charge point 32 receives the first charge pulse 17 from the controller 10 and the second charge point 34 receives the second charge pulse 18 from the controller 10, as described in greater detail below. The charge pump 30 is adapted to boost the battery voltage 22 to a boosted voltage 36 that is higher than the battery voltage 22. In an embodiment, the battery voltage 22 is 6 V and the boosted voltage 36 is 10 V.

The voltage adjuster 40, as shown in FIGS. 1 and 3, receives the boosted voltage 36 from the charge pump 30 and the shock pulse 19 from the controller 10. The voltage adjuster 40 outputs an adjusted voltage 42 based on the boosted voltage 36 and the shock pulse 19; the voltage adjuster 40 ensures that the adjusted voltage 42 is output at a consistent voltage level. In an embodiment, the adjusted voltage 42 is 10 V.

The transformer 50, as shown in FIGS. 1 and 3, has a primary coil 52 and a secondary coil 54 inductively coupled to the primary coil 52. The primary coil 52 has a primary number of turns that is less than a secondary number of turns of the secondary coil 54, and the turns of the secondary coil 54 are oriented in a direction opposite to the turns of the primary coil 52. The primary coil 52 is connected to the battery 20 and receives the battery voltage 22 from the battery 20. In an embodiment, the transformer 50 is a flyback transformer.

The field-effect transistor 60, as shown in FIGS. 1 and 3, receives the adjusted voltage 42 from the voltage adjuster 40. In an embodiment, the field-effect transistor 60 is a metal-oxide-semiconductor field-effect transistor (MOSFET). The field-effect transistor 60, based on the adjusted voltage 42 received from the voltage adjuster 40, acts as a gate to allow or prevent a primary current from the battery 20 from flowing through the primary coil 52.

At least one of the plurality of shocking plates 70, as shown in FIGS. 1 and 3, is electrically connected to the secondary coil 54. As described in greater detail below with reference to FIGS. 4-6, at least one of the shocking plates 70 receives a shock output voltage 56 from the secondary coil 54 induced from the current flowing through the primary coil 52. In an embodiment, one of the shocking plates 70 is indirectly connected to the controller 10 through a protection circuitry; this shocking plate 70 does not receive the shock output voltage 56 from the secondary coil 54 but connects to ground through a diode.

A controlling 100 of the shock output voltage 56 executed by the shock cycle module 16 will now be described in greater detail with reference to FIGS. 1 and 4-6D.

A detection step 110, as shown in FIG. 4, initiates the shock cycle module 16. In the detection step 110, the shock cycle module 16 detects whether an animal is positioned on the shocking plates 70. The shock cycle module 16 has a detected state and an open state. In the detected state, the shock cycle module 16 determines that an animal is positioned on the shocking plates 70 by detection of a predetermined impedance across the shocking plates 70, with the animal itself connecting the shocking plates 70. In the open state, the shock cycle module 16 determines that no animal is positioned on the shocking plates 70 by detection of an open circuit between the shocking plates 70. In an exemplary embodiment, the predetermined impedance is ten kilohms to one megohm, corresponding to a resistance level of a rat. In other embodiments, the predetermined impedance level may be adjusted to correspond to the resistance level of any other animal for which the trap is intended. In other embodiments, the shock cycle module 16 could be initiated based on any other detection of the presence of an animal on the shocking plates 70.

In a battery determination step 120, as shown in FIG. 4, the shock cycle module 16 determines the battery capacity 24 of the battery 20 after the shock cycle module 16 is initiated. The controller 10 receives the battery voltage 22 of the battery 20. The shock cycle module 16 determines the battery capacity 24 based on a relationship between the battery voltage 22 and the battery capacity 24 stored in the memory 14. For a 6 V battery 20, for example, a battery voltage 22 of 6 V corresponds to a battery capacity 24 of 100%, and a battery voltage 22 of approximately 4.8 V corresponds to a battery capacity 24 of 0%. In an embodiment, the relationship between the battery voltage 22 and the battery capacity 24 is linear and, in other embodiments, the shock cycle module 16 may determine the battery capacity 24 by any other method.

In a total shock time step 130, as shown in FIG. 4, the shock cycle module 16 sets a total shock time for applying the shock output voltage 56 to the shocking plates 70 for a single detection of an animal on the shocking plates 70. The total shock time, as described in greater detail below, includes a plurality of shock cycles 200 as shown in FIGS. 5A-6D. In an embodiment, if the animal detected on the shocking plates 70 is a mouse, the total shock time is 20 seconds. In another embodiment, if the animal detected on the shocking plates 70 is a rat, the total shock time is 120 seconds. In other embodiments, the particular animal detected on the shocking plates 70 and the total shock time can vary based on the desired application.

The shock cycle module 16 calculates a wait time 240 and a shock enable time 230 of the shock cycle 200, shown in FIGS. 5A-6D, in a shock cycle calculation step 140 shown in FIG. 4. In an embodiment, the wait time 240 is calculated according to the following equation:

$$\text{Wait Time} = 6*(\text{Battery Capacity}) + 800 \qquad \text{(Equation 1)}$$

The shock cycle module 16 performs the calculation of Equation 1 with the battery capacity 24 determined from step 120 in units of whole number percentages (i.e. percentage*100), calculating the wait time 240 in units of microseconds (μs). In an embodiment, the shock enable time 230 is calculated according to the following equation:

$$\text{Shock Enable Time} = 2300 - \text{Wait Time} \qquad \text{(Equation 2)}$$

The shock cycle module 16 performs the calculation of Equation 2 after the wait time 240 is calculated, calculating the shock enable time 230 in units of microseconds.

Although each of the shock enable time 230 and the wait time 240 depend on the battery capacity 24 as shown in the above equations, a total duration of the shock enable time 230 and the wait time 240 is the same and is independent of the battery capacity 24. In the shown embodiment, the total duration of the shock enable time 230 and the wait time 240 is 2.3 ms.

With the shock enable time 230 and the wait time 240 calculated, the shock cycle module 16 performs a start charge pump step 150, shown in FIG. 4. In the step 150, the shock cycle module 16 controls the controller 10 to send the first charge pulse 17 to the first charge point 32, and thereafter sends the second charge pulse 18 to the second charge point 34. The shock cycle module 16 continues to control the controller 10 to alternatingly send the first charge pulse 17 to the first charge point 32 and the second charge pulse 18 to the second charge point 34 for a number of cycles. In an embodiment, the number of cycles is 20, and the first charge pulse 17 and the second charge pulse 18 each have a duration of 1 millisecond (ms). The step 150 in part allows the charge pump 130 to boost the battery voltage 22 to the boosted battery voltage 36 that is sufficient to operate the field-effect transistor 60.

After the charge pump 30 is activated in the start charge pump step 150, as shown in FIG. 4, the shock cycle module 16 executes a shock cycle process 160 corresponding to the shock cycle 200 shown in FIGS. 5A-6D.

In a first pulse step 162 of the shock cycle process 160, as shown in FIG. 4, the shock cycle module 16 controls the controller 10 to send the first charge pulse 17 to the first charge point 32 for a first charge pulse time 210 shown in FIGS. 5A-6D. In the shown embodiment, the first charge pulse time 210 is 1 ms.

In a second pulse step 164 of the shock cycle process 160, as shown in FIG. 4, the shock cycle module 16 controls the controller 10 to send the second charge pulse 18 to the second charge point 34 for a second charge pulse time 220 shown in FIGS. 5A-6D. The second charge pulse time 220 is the same as the first charge pulse time 210 and, in the shown embodiment, is 1 ms. In addition to the start charge pump step 150, the steps 162 and 164 allow the charge pump 130 to boost the battery voltage 22 to the boosted voltage 36 that is sufficient to operate the field-effect transistor 60.

In a shock pulse step 166 of the shock cycle process 160, as shown in FIG. 4, the shock cycle module 16 activates the field-effect transistor 60. The shock cycle module 16 controls the controller 10 to output the shock pulse 19 through the voltage adjuster 40 and to the field-effect transistor 60. With the boosted voltage 36 from steps 150, 162, and 164, and the shock pulse 19, the adjusted voltage 42 output by the voltage adjuster 40 is sufficient to activate the field-effect transistor 60. The shock pulse 19 is output by the controller 10 for the shock enable time 230 determined in step 140, activating the field-effect transistor 60 for the shock enable time 230. In an embodiment, in the shock pulse step 166, the shock cycle module 16 also controls the controller 10 to send the first charge pulse 17 to the charge pump 30 for the shock enable time 230 to maintain a charge of the charge pump 30.

Figure 5A:
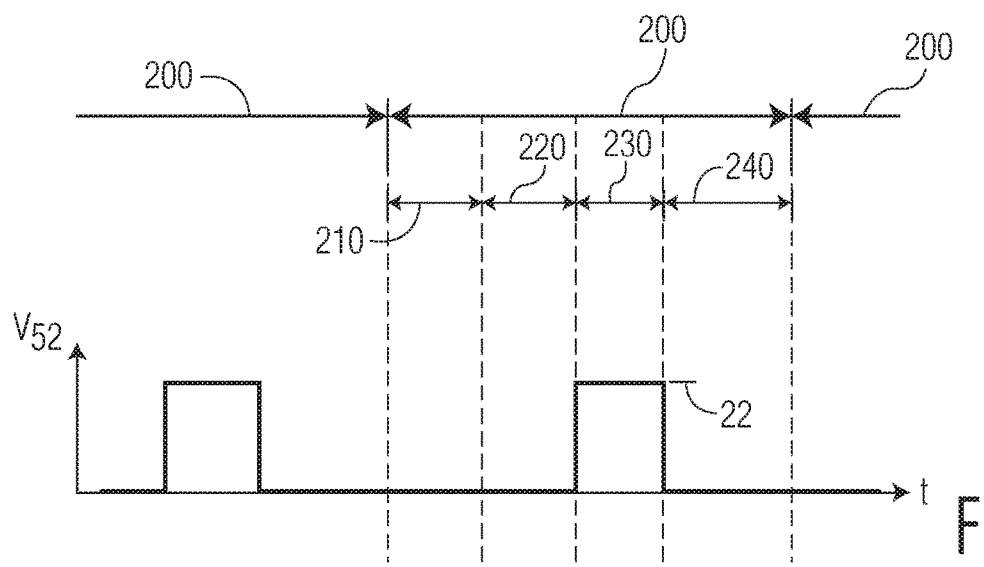
FIG. 5A is a graph of a voltage in a primary coil of a transformer of the system according to a first embodiment.
Figure 5B:
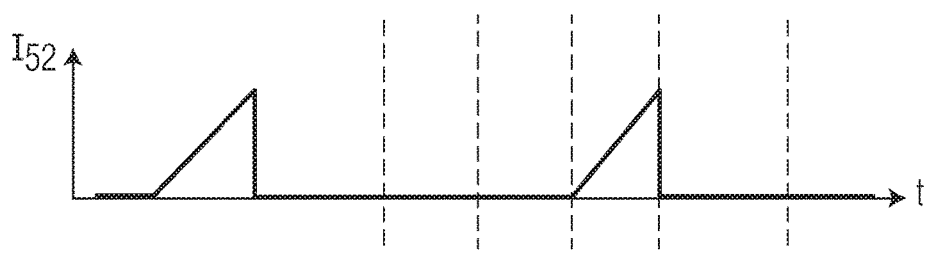
FIG. 5B is a graph of a current in the primary coil in the first embodiment.
Figure 5C:
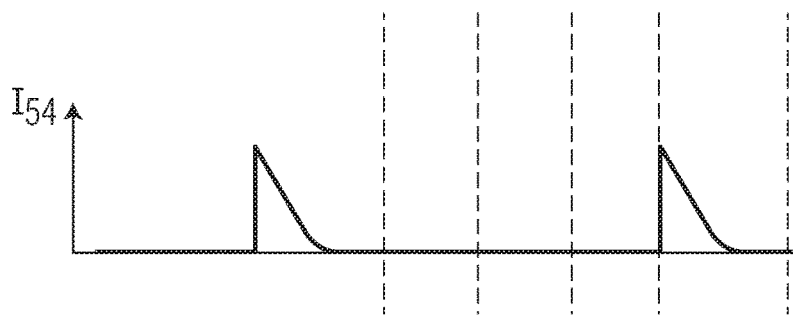
FIG. 5C is a graph of a current in a secondary coil of the transformer of the first embodiment.
Figure 5D:
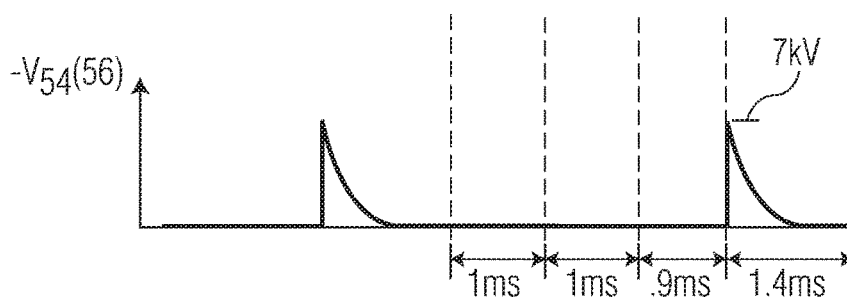
FIG. 5D is a graph of a shock output voltage of the secondary coil in the first embodiment.
Figure 6A:
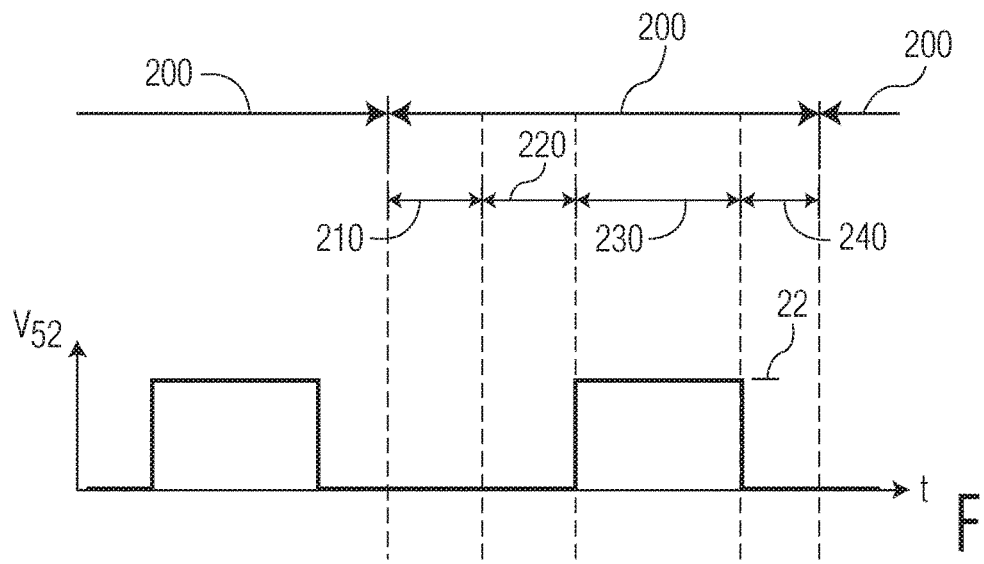
FIG. 6A is a graph of the voltage in the primary coil according to a second embodiment.
Figure 6B:
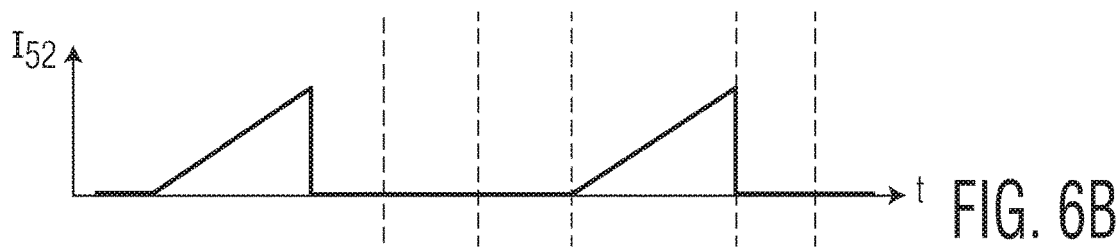
FIG. 6B is a graph of the current in the primary coil in the second embodiment.
Figure 6C:
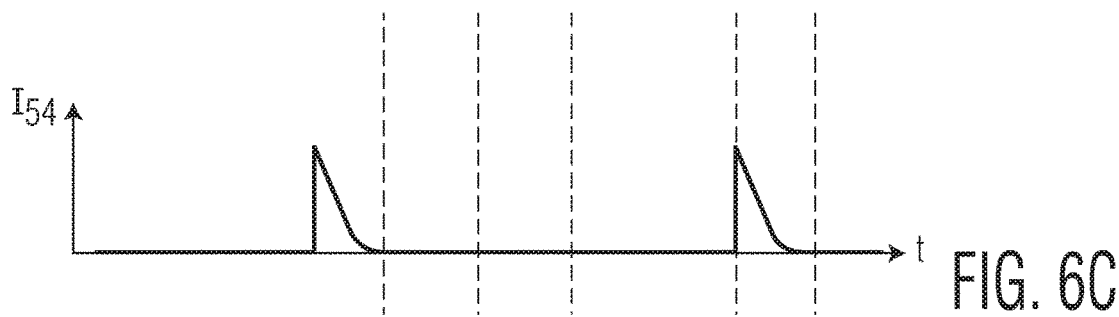
FIG. 6C is a graph of the current in the secondary coil in the second embodiment.

FIGS. 5A-5D show a plurality of shock cycles 200 according to a first exemplary embodiment and FIGS. 6A-6D show a plurality of shock cycles 200 according to a second exemplary embodiment. As shown in FIGS. 5A and 6A, the activation of the field-effect transistor 60 in step 166 of FIG. 4 applies the battery voltage 22 to the primary coil 52 and, as shown in FIGS. 5B and 6B, allows a primary current 152 corresponding to the battery voltage 22 to increase in the primary coil 52 for the shock enable time 230.

In a wait step 168 of the shock cycle process 160, as shown in FIG. 4, the shock cycle module 16 sends the second charge pulse 18 to the second charge point 34 for the wait time 240 determined in step 140.

Figure 6D:
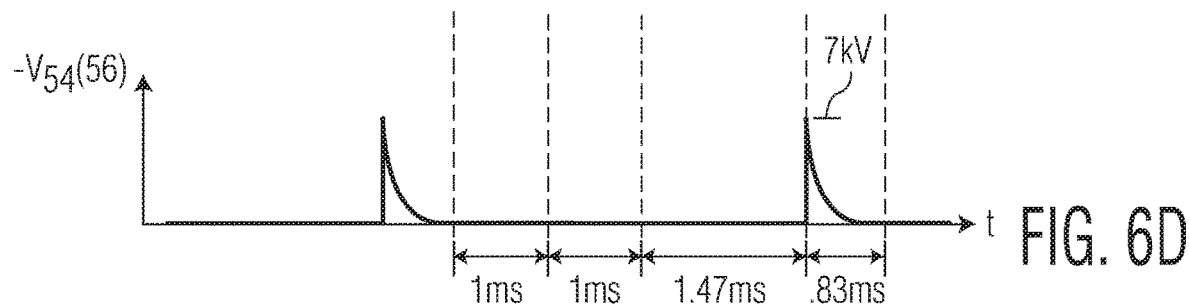
FIG. 6D is a graph of the shock output voltage of the secondary coil in the second embodiment.

At the end of the shock enable time 230, and the transition of the shock pulse step 166 to the wait step 168, the field-effect transistor 60 is switched off or deactivated. When the field-effect transistor 60 is switched off, the primary current 152 in the primary coil 52 shown in FIGS. 5B and 6B induces a secondary current 154 in the secondary coil 54 shown in FIGS. 5C and 6C. Because the secondary number of turns of the secondary coil 54 is greater than the primary number of turns of the primary coil 52, and is oriented in an opposite direction, the shock output voltage 56 output from the secondary coil 54 and applied to the shocking plates 70, shown in FIGS. 5D and 6D, is much larger than the battery voltage 22 and has a negative charge. In an embodiment, the shock output voltage 56 is approximately 7 kV. In other embodiments, the particular value of the shock output voltage 56 can be different based on the application.

The shock cycle process 160, corresponding to a single shock cycle 200, ends at the end of the wait time 240 in step 168. In an embodiment, the single shock cycle 200 has a total length of 4.3 ms. As shown in FIG. 4, after the wait step 168, the shock cycle module 16 compares a current shock time to the total shock time determined in step 130, the current shock time reflective of a time for the shock cycle process 160. If the current shock time is less than the total shock time, the shock cycle module 16 initiates the shock cycle process 160 again, resulting in additional shock cycles 200 as shown in FIGS. 5A-6D. The shock cycle module 16 continues to loop through the shock cycle process 160 until the current shock time is greater than or equal to the total shock time, upon which the process of controlling 100 the shock output voltage 56 ends.

As shown in the embodiment of FIGS. 5A-5D and the embodiment of FIGS. 6A-6D, the calculation of the shock enable time 230 depending on the battery capacity 24 results in a shock output voltage 56 that is the same regardless of the battery capacity 24. The battery voltage 22 and the amount of time that the field-effect transistor 60 remains open in the shock pulse step 166, determined by the shock enable time 230, determine an energy stored in the transformer 50 that can induce the secondary current 154 in the secondary coil 54. Targeting a same peak primary current 152 in the primary coil 52, as shown in FIGS. 5B and 6B, induces a same secondary current 154 in the secondary coil 54 at the switching off of the field-effect transistor 60, which creates a same shock output voltage 56. The control based on the calculated shock enable time 230 permits the shock output voltage 56 to be independent of the battery capacity 24.

FIGS. 5A-5D show an exemplary embodiment in which the battery capacity 24 is 100%; in this embodiment, the shock enable time 230 is 0.9 ms according to Equation 1 and Equation 2 above. FIGS. 6A-6D conversely show an exemplary embodiment in which the battery capacity 24 is 5%; in this embodiment, the shock enable time 230 is 1.47 ms according to Equation 1 and Equation 2. Because the battery voltage 22 is lower in the exemplary embodiment of FIGS. 6A-6D, the field-effect transistor 60 must remain activated for a longer shock enable time 230 in order to achieve a target peak primary current 152 in the primary coil 52. This calculation allows the output of a consistent shock output voltage 56, 7,500 kV in the shown embodiment, prolonging the life of the battery 22 and maintaining the shock output voltage 56 at an ideal level for effectiveness.

In other embodiments, the single shock cycle 200 can have any total length between 2 μs and 1 second, and the shock enable time 230 can have any length between 1 μs and 500 ms, provided the shock enable time 230 is adjusted based on the battery 20 condition as described above. In another embodiment, the first pulse step 162 and the second pulse step 164 can be omitted, with each shock cycle process 160 starting with the shock pulse step 166 and including only the shock enable time 230 and the wait time 240.

What is claimed is:

1. A system for controlling a shock output of an electronic animal trap, comprising:
    a battery;
    a transformer having a primary coil connected to the battery; and
    a controller connected to the battery and the primary coil, the controller having a shock cycle module, the shock cycle module:
        determining a battery capacity of the battery;
        determining a wait time based on the battery capacity;
        determining a shock enable time based on the wait time and a predetermined fixed shock cycle duration, the determined shock enable time being variable between a plurality of non-zero times as a function of the determined battery capacity, the fixed shock cycle duration being independent of the battery capacity and including the wait time and the shock enable time; and controlling a primary current from the battery to run through the primary coil for the shock enable time.

2. The system of claim 1, wherein the transformer has a secondary coil inductively coupled to the primary coil.

3. The system of claim 2, wherein the secondary coil outputs a shock output voltage based on a secondary current induced in the secondary coil by the primary current, the shock output voltage is independent of the battery capacity.

4. The system of claim 3, further comprising a shocking plate connected to the secondary coil and receiving the shock output voltage.

5. The system of claim 3, wherein the primary coil has a primary number of turns and the secondary coil has a secondary number of turns, the secondary number of turns is greater than the primary number of turns and the secondary number of turns is oriented in a direction opposite to the primary number of turns.

6. The system of claim 1, further comprising a field-effect transistor connected to the primary coil, the shock cycle module controls the primary current in the primary coil by controlling when the field-effect transistor is activated.

7. The system of claim 6, further comprising a charge pump connected to the controller and the battery, the charge pump boosting a battery voltage of the battery to a boosted voltage higher than the battery voltage.

8. The system of claim 7, further comprising a voltage adjuster connected to the charge pump, the controller, and the field-effect transistor, the voltage adjuster outputs an adjusted voltage to the field-effect transistor to activate the field-effect transistor, the voltage adjuster outputs the adjusted voltage based on a shock pulse from the controller, the shock pulse is sent from the controller to the voltage adjuster for the shock enable time.

9. The system of claim 1, wherein the shock cycle module sets a total shock time for applying the shock output voltage, the total shock time being independent from the shock enable time and a voltage of the battery and set according to a type of animal detected by the trap.

10. The system of claim 1, wherein the fixed shock cycle duration is independent of a voltage of the battery.

11. The system of claim 1, wherein the battery capacity is determined based on a predetermined relationship between a measured battery voltage and battery capacity stored in the system.

12. A method of controlling a shock output of an electronic animal trap, comprising:
providing a battery, a transformer having a primary coil connected to the battery, and a controller connected to the battery and the primary coil;
determining a first battery capacity of the battery;
determining a wait time based on the battery capacity;
calculating a first shock enable time based on the wait time and a predetermined fixed shock cycle duration, the calculated first shock enable time being variable between a plurality of non-zero times as a function of the detected first battery capacity, the fixed shock cycle duration being independent of the battery capacity and a voltage of the battery and including the wait time and the first shock enable time; and
controlling a primary current from the battery to run through the primary coil for the first shock enable time with a shock cycle module of the controller.

13. The method of claim 12, wherein the transformer has a secondary coil inductively coupled to the primary coil.

14. The method of claim 13, further comprising outputting a shock output voltage at the secondary coil based on a secondary current induced in the secondary coil by the primary current, the shock output voltage is independent of the battery capacity.

15. The method of claim 14, further comprising providing a plurality of shocking plates, at least one of the shocking plates is connected to the secondary coil and receives the shock output voltage.

16. The method of claim 14, further comprising setting a total shock time with the shock cycle module, the total shock time including a plurality of shock cycles each outputting the shock output voltage, the total shock time being independent of the battery voltage and set according to a type of animal detected by the trap.

17. The method of claim 16, wherein the shock cycle module controls the primary current in the primary coil by activating a field-effect transistor connected to the primary coil for the shock enable time in each shock cycle.

18. The method of claim 17, wherein the shock cycle module activates the field-effect transistor by outputting a shock pulse from the controller to a voltage adjuster connected to the field-effect transistor for the shock enable time.

19. The method of claim 18, wherein the field-effect transistor is deactivated after the shock enable time in each shock cycle, inducing the secondary current in the secondary coil.

20. The method of claim 19, further comprising providing a charge pump connected to the controller at a first charge point and a second charge point.

21. The method of claim 20, wherein the shock cycle module sends a second charge pulse from the controller to the second charge point for the wait time after the shock enable time in each shock cycle.

22. The method of claim 21, further comprising sending a first charge pulse from the controller to the first charge point and then sending the second charge pulse from the controller to the second charge point prior to the shock enable time in each shock cycle.

23. The method of claim 21, further comprising starting the charge pump prior to the shock cycles by alternatingly sending a first charge pulse from the controller to the first charge point and the second charge pulse from the controller to the second charge point.

24. The method of claim 12, further comprising the steps of:
after controlling the primary current from the battery to run through the primary coil for the calculated first shock enable time, determining a second battery capacity of the battery, distinct from the first capacity;
calculating a second non-zero shock enable time, distinct from the first shock enable time, as a function of the determined second battery capacity; and
controlling the primary current from the battery to run through the primary coil for the second shock enable time with the shock cycle module of the controller.

25. A system for controlling a shock output of an electronic animal trap, comprising:
a battery;
a charge pump boosting a battery voltage of the battery; and
a controller connected to the battery, and to the charge pump at a first charge point and a second charge point, the controller having a shock cycle module, the shock cycle module:
determining a battery capacity of the battery;

setting a total shock time, the total shock time being independent of the battery voltage and including a plurality of shock cycles each having a predetermined fixed duration, the fixed duration being independent of the battery capacity;

determining a wait time based on the battery capacity;

determining a shock enable time of each shock cycle of the plurality of shock cycles within the total shock time, the shock enable time based on the wait time and the predetermined fixed shock cycle duration and being variable between a plurality of non-zero times as a function of the determined battery capacity;

with the charge pump, charging the first charge point for a first charge pulse time and charging the second charge point for a second charge pulse time, the predetermined fixed shock cycle duration including the first charge pulse time, the second charge pulse time, the wait time and the shock enable time;

outputting a shock pulse for the shock enable time; and repeating the steps of charging the first and second charge points and outputting the shock pulse until a current total shock time is greater than or equal to the set total shock time.

26. The system of claim 25, wherein:

the shock enable time is equal to the wait time subtracted from the predetermined fixed shock cycle duration; and the battery capacity is determined based on a predetermined relationship between a measured battery voltage and battery capacity stored in the system.

27. The system of claim 25, wherein the total shock time is set according to a type of animal detected by the trap.

\* \* \* \* \*